United States Patent [19]

Russell et al.

[11] Patent Number: 5,420,049
[45] Date of Patent: May 30, 1995

[54] METHOD OF CONTROLLING PHOTOEMISSION FROM POROUS SILICON USING ION IMPLANTATION

[75] Inventors: Stephen D. Russell, San Diego; Wadad B. Dubbelday, Spring Valley; Randy L. Shimabukuro, San Diego; Diane M. Szaflarski, San Diego, all of Calif.

[73] Assignee: The United States of America as represented by the Secretary of the Navy, Washington, D.C.

[21] Appl. No.: 118,901

[22] Filed: Sep. 9, 1993

[51] Int. Cl.$^6$ ............... H01L 33/00; H01L 21/465
[52] U.S. Cl. ........................... 437/24; 437/71; 437/127
[58] Field of Search ............... 437/24, 71, 905, 2, 437/3; 257/3; 148/DIG. 83, DIG. 98, DIG. 99

[56] References Cited

U.S. PATENT DOCUMENTS

| | | | |
|---|---|---|---|
| 4,532,700 | 8/1985 | Kinney et al. | 148/DIG. 37 |
| 4,810,667 | 3/1989 | Zorinsky et al. | 437/71 |
| 5,110,755 | 5/1992 | Chen et al. | 437/71 |
| 5,285,078 | 2/1994 | Mimura et al. | 257/3 |

OTHER PUBLICATIONS

Sze, S. M., Physics of Semiconductor Devices (2nd ed.), Wiley, New York.
Cullis, A. G. et al, Nature, 353, 1991, 335 Date unknown.
Fathauer, R. W. et al, Appl. Phys. Lett., 60, 1992, 995.
Sarathy, J. et al, Appl. Phys. Lett., 60, 1992, 1532.
Dubbelday, W. B. et al., Appl. Phys. Lett., 62, 1993, 1694.
Hou, X. Y. et al, Appl. Phys. Lett., 62, 1993, 1097.
Koshida, N. et al, Appl. Phys. Lett., 60, 1992, 347.
Steiner, P. et al, Mat. Res. Soc. Symp. Proc., 283, 1993, 343.
Maruska, H. P. et al, Appl. Phys. Lett., 61, 1992, 1338.
Barbour, J. C. et al, Appl. Phys. Lett., 59, 1991, 2088.
Morehead, F. F. et al, "A Model for the Formation of Amorphous Si by Ion Bombardment" Date unknown.
Canham, L. T., "Silicon Quantum Wire Array Fabrication by Electrochemical and Chemical Dissolution of Wafers" Date unknown.
Shih, S. et al, "Control of Porous Si Photoluminescence Through Dry Oxidation".
Parsons, J. R., "Conversion of Crystalline Germanium to Amorphous Germanium by Ion Bombardment" Date unknown.
Ziegler, J. F. et al, "The Stopping Range of Ions in Matter", Pergamon Press, New York, 1985.

Primary Examiner—Olik Chadhuri
Assistant Examiner—S. Mulpuri
Attorney, Agent, or Firm—Harvey Fendelman; Thomas Glenn Keough

[57] ABSTRACT

This invention describes a method of controlling light emission from porous silicon and porous silicon devices using ion implantation. The emitted light intensity can be either selectively increased or decreased by suitable processing of the silicon prior to the fabrication of the porous layer. Amorphizing the silicon prior to the fabrication of the porous layer quenches the light emission. Ion implantation with doses below the amorphization level enhances the intensity of the emitted light of the subsequently fabricated porous layer.

7 Claims, 2 Drawing Sheets

METHOD OF CONTROLLING PHOTOEMISSION FROM POROUS SILICON USING ION IMPLANTATION

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED PATENT APPLICATION

This invention is related to a co-pending patent application entitled "Photonic Silicon on a Transparent Substrate" by S. D. Russell et al., United States Patent and Trademark Office Ser. No. 08/118, 900.

BACKGROUND OF THE INVENTION

The band structure for single crystal silicon exhibits a conduction band minimum which does not have the same crystal momentum as the valence band maximum, yielding an indirect gap. Therefore, in silicon, radiative recombination can only take place with the assistance of a phonon making such transitions inefficient. This has prevented silicon from being used as a solid state source of light, unlike group III-V semiconductors which have a direct gap at the center of the Brillouin zone. A review of these materials properties can be found in S. M. Sze, *Physics of Semiconductor Devices*, 2nd. Edition (New York: John Wiley & Sons, 1981). The discovery of photoluminescence in porous silicon has therefore generated a new optoelectronic material for study. A selected review of the fabrication techniques and properties of porous silicon can be found in the articles entitled: "Silicon quantum wire array fabrication by electrochemical and chemical dissolution of wafers" by L. T. Canham, *Appl. Phys. Lett.*, 57, 1046 (1990); "Visible light emission due to quantum size effects in highly porous crystalline silicon" by A. G. Cullis et al., *Nature*, 353, 335 (1991); "Visible luminescence from silicon wafers subjected to stain etches" by R. W. Fathauer et al., *Appl. Phys. Lett.*, 60, 995 (1992); "Demonstration of photoluminescence in nonanodized silicon" by J. Sarathy et al., *Appl. Phys. Lett.*, 60, 1532 (1992); and "Photoluminescent thin-film porous silicon on sapphire", by W. B. Dubbelday et al., *Appl. Phys. Lett.*, 62, 1694 (1993).

Porous silicon is formed using electrochemical etching, photochemical etching or stain etching of bulk silicon or silicon-on-sapphire (SOS) wafers as described in the above references. The substrate may be suitably patterned lithographically prior to the etch to define device structures or confine the region exposed to the etch solution. The typical emission spectrum of porous silicon is in the red, orange and yellow region (nominally 500 to 750 nm) although green and blue emission has also been demonstrated. Blue shift of the peak emission wavelength has been shown by increased oxidation and etching of the porous silicon as described in "Control of porous Si photoluminescence through dry oxidation" by S. Shih et al., *Appl. Phys. Lett.*, 60, 833 (1992) and in "Large blue shift of light emitting porous silicon by boiling water treatment" by X. Y. Hou et al., *Appl. Phys. Lett.*, 62, 1097 (1993). These references teach ways to control the wavelength of the emitted light from the porous silicon, but do not teach ways in which the intensity of the emitted light (photoluminescence or electroluminescence) can be controlled. At this time the light emitting mechanism is not fully understood. The scientific controversy surrounding the detailed physical mechanism behind the light emission has not, however, hindered the ability to fabricate porous silicon layers and useful light emitting devices using this technology as described in "Visible electroluminescence from porous silicon" by N. Koshida et al., *Appl. Phys. Lett.*, 60, 347 (1992); "New Results on Electroluminescence from Porous Silicon" by P. Steiner et al., in *Microcrystalline Semiconductors: Materials Science & Devices*, Materials Research Society Proceedings, 283, 343 (1993) and in "Current injection mechanism for porous-silicon transparent surface light-emitting diodes" by H. P. Maruska et al., Appl. Phys. Lett. 61, 1338 (1992).

The use of ion irradiation to quench the light emission from porous silicon has been reported in "Ion-irradiation control of photoluminescence from porous silicon" by J. C. Barbour et al., Appl. Phys. Lett., 59, 2088 (1991). In this report, the authors teach of high energy ion irradiation (24 MeV $Cl^{+5}$ ions and 250 keV $Ne^+$ ions) of a previously formed porous silicon region. The photoluminescence intensity of the ion irradiated porous silicon region can be reduced (at 0.012 eV/atom) and effectively turned-off (at 0.12 eV/atom) by low levels of damage. The amount of damage required to amorphize silicon is greater than 12 eV/atom, which is roughly ten times the value reported to completely quench the light emission. Due to the low levels of damage required to totally quench the photoluminescence using the teachings of the prior art, the processing window for irradiation doses is small which limits the degree over which the intensity can be lowered using this technique. Thus, in accordance with this inventive concept a need has been recognized for alternative techniques which are therefore desired to selectively and reproducibly decrease the intensity in predetermined areas using microelectronic fabrication techniques. Furthermore, the emergence of light emitting porous silicon and porous silicon devices has to date been limited to moderately low light levels. Methods of increasing the intensity of the emitted light are needed for most commercial and technological applications such as displays, light emitting diodes (LED's), optical interconnects and optoelectronic circuits. In accordance with this inventive concept a continuing need has been recognized in the state of the art for a method of controlling the photoemission of porous silicon using ion implantation.

SUMMARY OF THE INVENTION

The present invention is directed to providing a method of controlling the photoemission of porous silicon using ion implantation. The intensity of the light emitted by porous silicon layers and devices can be selectively increased or decreased by predetermined ion implantation doses prior to the formation of the porous region. Using ion implantation, the number, spatial and depth distribution of ions accelerated into the silicon can be accurately controlled. This in turn allows control of the defect (vacancy) density and distribution to selectively engineer the light emission. Ion implanted doses below the amorphization dose prior to the formation of the porous layer increases the light emission. Exceeding the amorphization dose prior to the formation of the porous layer, selectively quenches the light emission.

An object of this invention is to selectively increase the intensity of light emitted from porous silicon layers and devices.

Another object of this invention is to selectively decrease the intensity of light emitted from porous silicon layers and devices.

Yet another object of this invention is to use ion implantation into non-porous silicon to control the intensity of emitted light from subsequently fabricated porous silicon layers and devices.

Another object of this invention is to control the light emission from subsequently fabricated porous silicon layer and devices using techniques compatible with microelectronic device processing.

Yet another object of this invention is to use ion implantation to accurately control, in a predetermined manner, the intensity of emitted light from subsequently fabricated porous silicon layers and devices.

These and other objects of the invention will become more readily apparent from the ensuing specification and claims when taken in conjunction with the appended drawings.

DESCRIPTION OF THE PREFERRED EMBODIMENT

Figure 1:
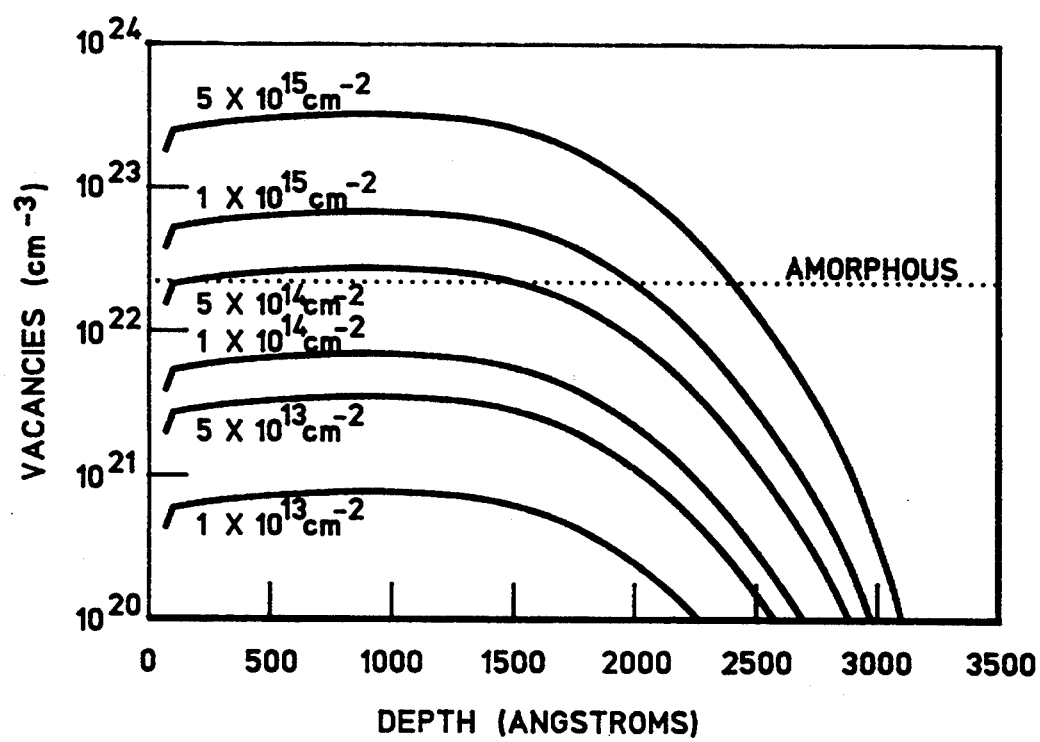
FIG. 1 shows the implant damage profile predicted by a Monte Carlo computer simulation.

The description of the preferred embodiment refers to a method of controlling the light emission from porous silicon by the selective ion implantation of the silicon prior to the fabrication of the porous layer. Using ion implantation, the number, spatial and depth distribution of ions accelerated and implanted into the silicon can be accurately controlled. This in turn allows control of the defect (vacancy) density and distribution to selectively engineer the light emission. Ion implanted doses below the amorphization dose prior to the formation of the porous layer increases the light emission. Exceeding the amorphization dose prior to the formation of the porous layer, selectively quenches the light emission.

The physics of ion implantation into solids is well established, and the formalism exists to predict the depth, distribution, concentration of the implanted ions and their effect on the target crystal structure. The control of ion implantation is obtained through a variety of parameters including: the implanted ion species, the implanted ion energy, the implanted ion dose, the angle of the implant, the spatial profile of the implant beam, the target wafer (sample) composition and crystallinity and the target wafer temperature. In practice the implant angle is usually a few degrees (less than 10) away from the normal to the target surface to minimize channeling the implanted ions deeply along the crystal planes of the target wafer. Also, in commercial implanters, the spatial distribution of the implanted ion beam is made uniform by rastering the beam over the surface of the target wafer which also minimizes heating of the sample. Therefore, in practical commercial implanters, these two parameters play a minimal role in the defect engineering. The minimizing the target temperature prevents "self-annealing" of the implant damage in the wafer. The detailed requirements for cooling the target will depend on the specific implanter used and the type of cooling system employed. In general maximum cooling is desired, which in the case of most commercial implanters corresponds to about $-30°$ C. at the back of the wafer.

To utilize the predetermining capability of the ion implantation technique for defect formation and ultimately in the control of the light emission from porous silicon layers, the critical dose required to yield an amorphous layer in the absence of vacancy out-diffusion was calculated using the formalism described in F. F. Morehead, Jr. et al., "A Model for the Formation of Amorphous Si by Ion Bombardment", in F. H. Eisen, L. T. Chadderton, eds., *Ion Implantation*, Gordon and Breach Science Publishers, N.Y. (*1971*). This is given by $$D_c = \frac{E_d n_t}{\left(\frac{dE}{dx}\right)} \text{ cm}^{-2}$$

where $D_c$ is the critical dose, $E_d$ is the effective energy to displace a target lattice atom (in eV), $n_t$ is the density of target atoms (cm$^{-3}$) and $dE/dx$ is the energy independent nuclear energy loss per unit path length. This energy loss factor can be approximated to yield the Nielson equation $$\left(\frac{dE}{dx}\right) \approx 7 \times 10^8 \rho_t Z_i^{2/3} \frac{M_i}{(M_i + M_t)} \text{ ev/cm}$$

with the ion and target masses denoted by $M_i$ and $M_t$ respectively, $\rho_t$ is the target density (in grams/cm$^2$) and $Z_i$ is the atomic number of the implanted ion. $E_d$ is taken as 25 eV, which is twice the estimate of the threshold energy required to break all bonds in silicon. In these embodiment, Si$^{28}$ ions will be used as the implanted species and crystalline silicon selected as the target. Therefore, $Z_i=14$, $M_i=M_t=28.09$, $\rho_t=2.328$ g/cm$^3$, and $n_t=5\times 10^{22}$ atoms/cm$^3$. This yields a critical dose $D_c=2.64\times 10^{14}$ cm$^{-2}$.

The widely used Monte Carlo simulation program "TRIM-90", version 6.0, which is described in J. F. Ziegler et al., *The Stopping Range of Ions in Matter*, Pergamon Press, New York (1985), was used to calculate vacancies in the silicon versus depth into the material for various implant energies. FIG. 1 shows the implant damage profile predicted for Si$^{28}$ ions implanted at 100 keV into a silicon wafer. Note that by increasing the implant dose, the number of vacancies (defects) increases at any given depth. At 100 keV, an amorphous region is formed about 150 nm deep with implants exceeding the critical amorphising dose predicted above.

Figure 2:
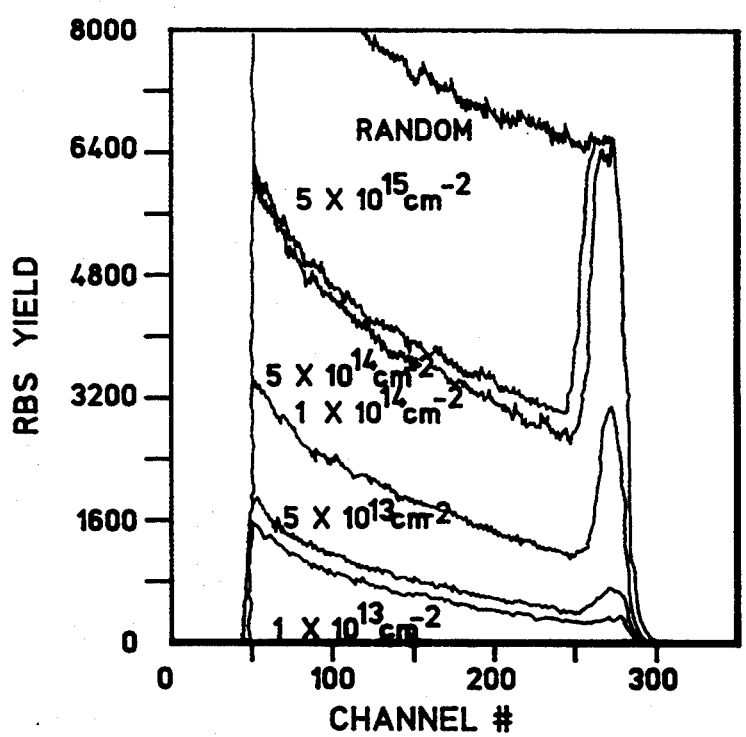
FIG. 2 shows channeled and random RBS spectra.

Rutherford Backscattering Spectroscopy (RBS) data, shown in FIG. 2 was obtained to support the crystal damage simulations, and confirm the predictability of the ion implantation process. The random spectrum results from scattering from a target of randomly distributed atoms since the incident beam enters the crystal at a direction not coinciding with any major crystallographic axes. Therefore, the RBS (backscattered) yield corresponds to that of an amorphous sample. This spectrum features an edge near channel number 290 corresponding to scattering from atoms near the surface, followed by a smoothly increasing yield due to scattering by atoms at greater depths in the crystal. Five examples of channeled spectra for ion damaged samples are also shown in FIG. 2. These spectra of various implanted doses exhibit peaks which is due to scattering from atoms displaced from their lattice sites by a length greater than the Thomas-Fermi screening length ($\sim$0.2 Å in Si). Upon increasing the dose to greater than $2.64\times10^{14}$ cm$^{-2}$, the number of displaced atoms (vacancies or defects) increases and the RBS (backscattered) yield is comparable to that of the random sample implying full amorphization.

The area under the peak in the backscattered yield corrected for dechanneling and surface scattering, is proportional to the amount of damage caused by the implantation. Note, this is greater than the number of displaced atoms since channeling measurements probe disorder in the various defect forms as well as displaced atoms. At lower doses ($<10^{14}$ cm$^{-2}$), the amount of damage increases linearly with increasing dose which is consistent with the electron microscopy study of J. R. Parsons entitled "Conversion of crystalline germanium to amorphous germanium by ion bombardment" in *Phil. Mag.*, 12, 1159 (1965) at oxygen ion doses $<10^{12}$ cm$^{-2}$ in germanium. Above the critical dose ($\sim2.64\times10^{14}$ cm$^{-2}$ as detailed above), a saturation regime exists. This indicates that at higher doses there is overlapping of the damaged microregions surrounding each ion track (due to cascading collisions) producing an amorphous region.

The increasing number of defects exhibited by the increase in the surface peak in the channeled RBS spectra is quantified using the ratio of channeled to random backscattered yield, $\chi_{min}\approx5$, 10, and 42% respectively for doses below the critical amorphizing dose. Ion doses of $5\times10^{14}$ cm$^{-2}$ and above yield an amorphous layer to a depth of roughly 150 nm. $\chi_{min}$ for these samples is 100% which corresponds to no long range order (amorphous).

Given silicon samples with a range of predetermined and verified crystalline damage, porous silicon was fabricated using techniques practiced in the art. Porous silicon is commonly fabricated by anodic oxidation of silicon in hydrofluoric acid (HF) solutions (i.e. electrochemical etching). A solution of equal parts of HF and ethanol is typically used in a conventional electrochemical cell with a platinum cathode and the silicon forming the anode. Current densities from about 1 to 100 mA are passed through the solution causing dissolution of the silicon, and the creation of a physically porous structure with a reduction in density. This technique can be used to fabricate thick porous silicon films on bulk silicon where it is straight-forward to apply electrical contact to the backside of the sample (wafer). An alternative porous silicon fabrication technique employed here for demonstration uses a chemical stain etch which comprises a solution of HF:HNO$_3$:de-ionized H$_2$O typically in the ratio of (1:5:10). Both bulk silicon and SOS wafers can be similarly processed. The etch solutions are typically prepared by reacting a square centimeter of silicon with the HF:HNO$_3$ mixture for 2 minutes causing an accumulation of HNO$_2$, the active oxidizer in the reaction. The chemical etch is a result of hole injection from the HNO$_3$ oxidant into the silicon substrate via the following net reaction:

$$Si + HNO_3 + 6HF \rightarrow H_2SiF_6 + HNO_2 + H_2O + H_2.$$

The reaction is catalyzed by the presence of NO$_2^-$ ions, and so there is usually an induction period observed for the etching process. De-ionized H$_2$O was subsequently added to the solution prior to immersion of the sample to be etched. Typical etch times ranged from 1 to 15 minutes. The samples were rinsed with deionized water, dried with nitrogen.

A portion of the ion damaged samples were protected from the etch solution by a thin layer of Crystalbond clear wax. The depth of etch into the sample was measured using stylus profilometry after spectral analysis and removal of the wax. The total depth of the porous silicon layer was determined using SEM photomicrographs. The damage effect on etch rate was characterized to insure that the etched porous layer was confined to the damaged region and not the underlying bulk material.

Table I shows the effect of implant damage on the etch rate. Not surprisingly, the etch rate increases with increasing ion damage, as the stain etch described above can be used to preferentially etch and decorate silicon crystal damage. The effect of crystal damage on photoluminescence and peak wavelength is also shown. The etch times were tailored to etch approximately the same depth into the sample. SEM photomicrographs were used to establish porous silicon layer thickness, which varied between 50 and 200 nm. Results from etch depths of $\sim$200 nm are shown in the table, results from shorter etch depths are comparable. The photoluminescence intensity increases with increasing ion damage while the silicon is still partially crystalline. However, above the amorphization level ($\chi_{min}=100\%$), no photoluminescence was observed. No correlation was found between implantation damage and the peak wavelength or the apparent PS layer thickness.

TABLE I

| Si Dose (cm$^{-2}$) | Photoluminescence and Etch Properties vs. Implant Damage | | | |
|---|---|---|---|---|
| | $\chi_{min}$ (%) | Etch Rate (nm/min) | Intensity at $\lambda_{max}$ (Scaled A. U.) | $\lambda_{Max}$ (nm) |
| 0.0 | N/A | 20 | 0.04 | 670 |
| $1\times10^{13}$ | 5 | 90 | 0.50 | 657 |
| $5\times10^{13}$ | 10 | 80 | 0.70 | 695 |
| $1\times10^{14}$ | 42 | 110 | 1.00 | 678 |
| $5\times10^{14}$ | 100 | 320 | none | none |
| $1\times10^{15}$ | 100 | 360 | none | none |
| $5\times10^{15}$ | 100 | 420 | none | none |

Figure 3:
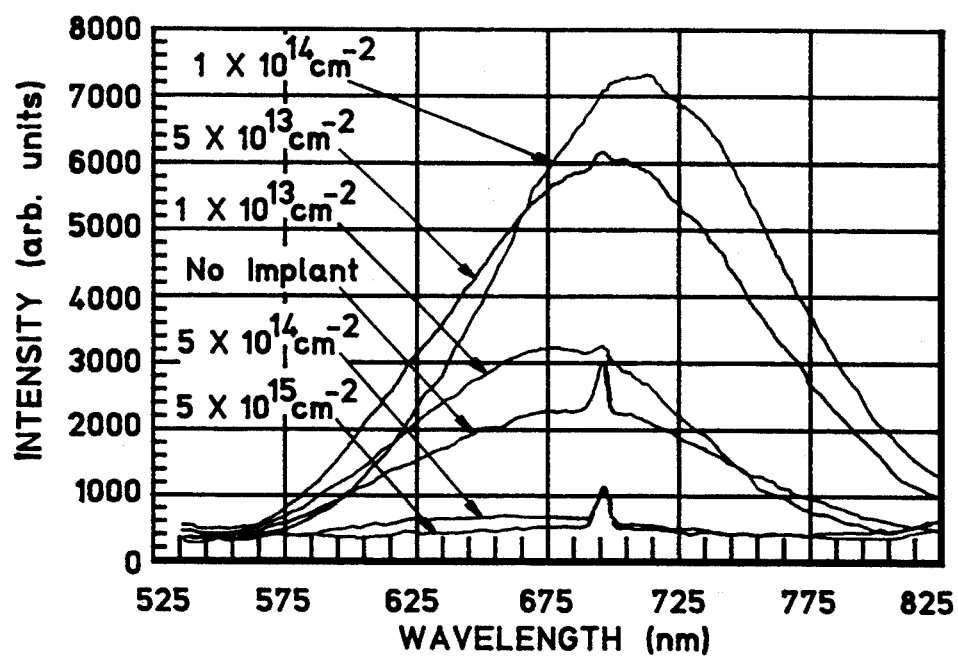
FIG. 3 shows the photoluminescence spectra for samples with controlled amounts of ion implantation damage.

Identical conditions were created starting with crystalline silicon layers deposited on sapphire (SOS). Again, ion implanting SOS with 100 keV Si$^{28}$ of varying doses was selected. The Monte Carlo simulation program TRIM and the a priori calculation for the critical amorphizing dose are identical in this situation. Porous silicon layers were fabricated in the ion implanted and damaged samples using the chemical stain etch described above. FIG. 3 shows the intensity of the photoluminescence of the porous silicon layers on sapphire for various controlled implant doses (i.e. crystalline damage). The photoluminescence spectra were obtained using $\sim$5 mW/cm$^2$ HeCd laser excitation at 442 nm. The photoluminescent emission is in the visible region of the spectrum, with peaks between 650 to 750 nm depending on etch conditions, typical of porous silicon. The emitted linewidth is $\sim$100 nm, consistent with the observed emission from bulk porous silicon.

The chromium line ($Cr^{+3}$ at 695 nm) from metal impurities in the sapphire is also excited and can be seen in the spectra.

FIG. 3 clearly shows the photoluminescence of the porous layer increases with increasing ion damage for partially crystalline silicon. The photoluminescent intensity increase may be attributed to an increase in the density of light emitting nanostructures due to enhanced etching of defects, although the full understanding and identification of the physical cause in not required for the application and use of this inventive method. However, above the amorphization dose no photoemission was observed unless etching continued into the partially damaged regions deeper into the sample. The spectra for heavily damaged samples ($>2.64\times10^{14}$ cm$^{-2}$) shown in FIG. 3 exhibit weak photoluminescence from this lower damaged region formed by the implant straggle. This is consistent with the results for bulk silicon, vide supra.

Figure 4:
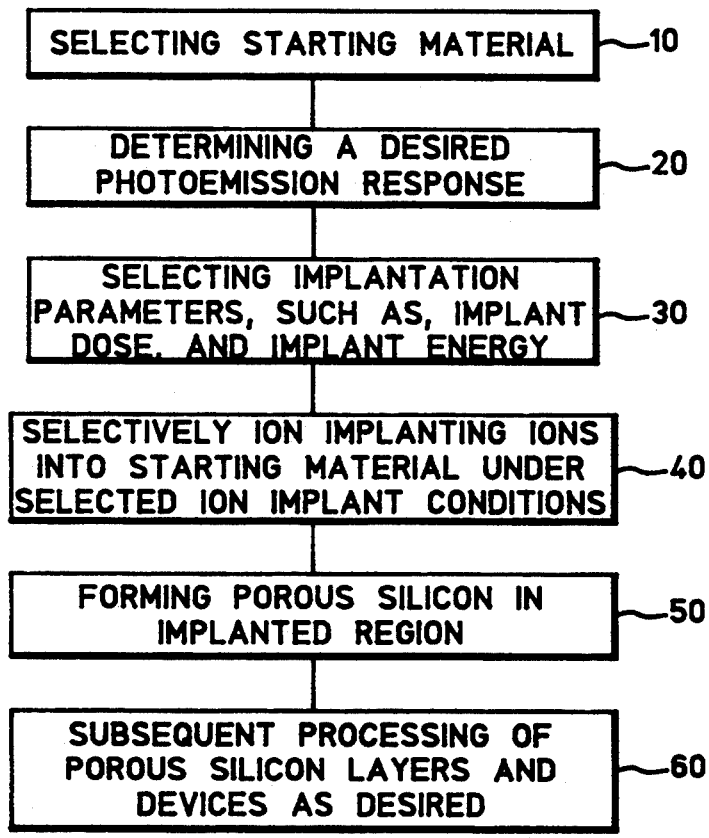
FIG. 4 depicts schematically the process flow for the inventive method.

FIG. 4 schematically summarizes the process flow for controlling the photoemission from porous silicon. First, a selecting of a starting material, for example bulk silicon, silicon-on-sapphire (SOS), SIMOX wafers or the like, is made. Next, a determining 20 of a desired photoemissive response must be made so that a selecting 30 of the implanted ion species, the energy and dose and temperature of the starting material can be effected for the job at hand. The selection of the desired photoemission covers a variety of emission (enhanced emission) levels. To enhance the light emission, larger doses of implanted ions (which are below the amorphization dose) are used. To quench the light emission, doses above the amorphization dose are used. Next, there is a selectively implanting 40 of ions in the starting material. Next, a forming 50 of porous silicon in the ion implanted starting material results from the action of suitable etching techniques practiced in the art so that a subsequent processing of the porous silicon layer may be made, if desired, into an optical or electro-optical device.

Table II shows typical ion implantation parameters to enhance the photoemission from porous silicon layers and devices. Various levels of the implanted doses of ions (up to the quenching amorphization dose) will produce different levels of photoemission. Table III shows typical ion implantation parameters to quench the photoemission from porous silicon layers and devices.

TABLE II

Typical Ion Implantation Parameters to Enhance Photoemission from Porous Silicon Layers and Devices

| | |
|---|---|
| Implanted Ion Species | $Si^{28+}$ |
| Implanted Ion Dose | $1 \times 10^{14}$ cm$^{-2}$ |
| Implanted Ion Energy | 100 keV |
| Starting (Target) Species | bulk silicon wafer |
| Starting (Target) Temperature | $-30°$ C. |
| Starting (Target) Orientation | 5 degrees off (100) orientation |

TABLE III

Typical Ion Implantation Parameters to Quench Photoemission from Porous Silicon Layers and Devices

| | |
|---|---|
| Implanted Ion Species | $Si^{28+}$ |
| Implanted Ion Dose | $5 \times 10^{15}$ cm$^{-2}$ |
| Implanted Ion Energy | 100 keV |
| Starting (Target) Species | bulk silicon wafer |
| Starting (Target) Temperature | $-30°$ C. |
| Starting (Target) Orientation | 5 degrees off (100) orientation |

It is noted that the intensity of the light emitted by porous silicon layers can be increased by selective ion implantation prior to the formation of the porous region. Using the number, spatial and depth distribution of ions accelerated into the silicon, ion implantation of a region, can predetermined and accurately controlled. This, in turn, allows control of the defect (vacancy) density and distribution to selectively engineer the light emission. Increasing ion implanted doses below the amorphization dose prior to the formation of the porous layer increases the light emission. Exceeding the amorphization dose prior to the formation of the porous layer, selectively quenches the light emission. This is contrary to the prior art that teaches of ion implantation of porous layers to quench light emission.

While the embodiment using silicon based materials: silicon, SOS, and SIMOX, has been emphasized herein,- the teachings herein will allow the ability control the photoemission in other porous structures in materials such as germanium, silicon-germanium alloys, silicon carbide and other semiconductors. Variations in implant parameters such as implant energy, implanted ion species, target temperature and the like will also be readily apparent to one skilled in the art from the teachings disclosed within.

Variations in the method of fabricating the porous layers can also be readily accommodated by this inventive concept. Furthermore, the detailed process flow may be modified such that this inventive process may be incorporated into the fabrication of optical and electro-optical devices as needed. In such case, lithographic definition of the ion implanted species may be desired or direct write ion beam systems may be employed.

Obviously, numerous modifications and variations of the present invention are possible in light of the above teachings. It is therefore to be understood that within the scope of the appended claims the invention may be practiced otherwise than as specifically described herein.

We claim:

1. A method of increasing photoemission from porous materials comprising:
   implanting ions into a region of a starting material at an ion dose below the amorphization dose of said starting material to effect implant damage therein; and
   forming a porous material in said region of said starting material containing said ions thereby increasing the photo emission.

2. A method according to claim 1, further including:
   maintaining said starting material at a cooling temperature to prevent self annealing of said starting material during said implanting.

3. A method according to claims 1 or 2 wherein said implanting is performed at increasing levels up to said amorphization dose to provide for corresponding levels of photoemission from said porous material.

4. A method according to claims 2 wherein said temperature is $-30°$ C.

5. A method according to claim 1 or 2 wherein said starting material is silicon, said ions are $Si^{28}$ and said amorphization dose is $2.64 \times 10^{14}$ cm$^{-2}$.

6. A method according to claim 1 or 2 wherein said starting material is selected from the group consisting of silicon, germanium, silicon carbide, silicon-germanium alloys, and other semiconductors.

7. A method according to claims 1 or 2 wherein said forming a porous material relies upon fabrication techniques selected from the group of chemical stain etching, electrochemical etching, photochemical etching and photoelectrochemical etching.

* * * * *